United States Patent
Otozawa et al.

(10) Patent No.: US 7,262,243 B2
(45) Date of Patent: Aug. 28, 2007

(54) COATING COMPOSITION, ANTIREFLECTION FILM, PHOTORESIST AND PATTERN FORMATION METHOD USING IT

(75) Inventors: Nobuyuki Otozawa, Yokohama-shi (JP); Toyomichi Shimada, Yokohama-shi (JP); Takashige Maekawa, Yokohama-shi (JP); Naoko Sumi, Ichihara-shi (JP)

(73) Assignee: Asahi Glass Company, Limited, Tokyo (JP)

( * ) Notice: Subject to any disclaimer, the term of this patent is extended or adjusted under 35 U.S.C. 154(b) by 30 days.

(21) Appl. No.: 11/190,855

(22) Filed: Jul. 28, 2005

(65) Prior Publication Data

US 2006/0004129 A1 Jan. 5, 2006

Related U.S. Application Data

(63) Continuation of application No. PCT/JP04/00739, filed on Jan. 28, 2004.

(30) Foreign Application Priority Data

Jan. 29, 2003 (JP) ............................. 2003-021060

(51) Int. Cl.
- *G03F 7/11* (2006.01)
- *G03F 7/004* (2006.01)
- *H01L 21/027* (2006.01)
- *B05D 5/06* (2006.01)
- *B32B 27/08* (2006.01)
- *B32B 27/36* (2006.01)

(52) U.S. Cl. ...................... 524/544; 427/164; 427/402; 427/169; 428/480

(58) Field of Classification Search ................ 524/544; 427/164; 428/480
See application file for complete search history.

(56) References Cited

U.S. PATENT DOCUMENTS 5,049,414 A * 9/1991 Kato .......................... 427/164

FOREIGN PATENT DOCUMENTS

| EP | 0 736 809 A1 | 10/1996 |
|---|---|---|
| EP | 1 542 078 A1 | 6/2005 |
| JP | 1-236935 | 9/1989 |
| JP | 08-044066 | * 2/1996 |
| JP | 9-90640 | 4/1997 |
| JP | 9-325500 | 12/1997 |
| JP | 09-325500 | * 12/1997 |
| JP | 11-124531 | 5/1999 |
| JP | 2001-194798 | 7/2001 |
| JP | 2002-236370 | 8/2002 |

OTHER PUBLICATIONS

Machine translation of JP-08-044066.*

* cited by examiner

*Primary Examiner*—Duane Smith
*Assistant Examiner*—Ives Wu
(74) *Attorney, Agent, or Firm*—Oblon, Spivak, McClelland, Maier & Neustadt, P.C.

(57) ABSTRACT

To provide a coating composition useful to form an antireflection film having a refractive index lower than 1.4, excellent in water solubility and long-term stability in the form of a water solution. A coating composition containing a fluoropolymer having ionic functional groups (such as a fluoropolymer having polymer units of $-CF_2CF[O(CF_2)_3COOH]-$), an acid and an aqueous medium.

16 Claims, No Drawings

COATING COMPOSITION, ANTIREFLECTION FILM, PHOTORESIST AND PATTERN FORMATION METHOD USING IT

TECHNICAL FIELD

The present invention relates to a coating composition. Particularly, it relates to a coating composition to be used for forming an antireflection film.

BACKGROUND ART

When a pattern of a photoresist is formed by photolithography, if interference of light reflected on the boundary between a photoresist layer and a substrate and on the surface of the photoresist layer occurs at the time of exposure, the dimensional accuracy of the pattern will be decreased. For the purpose of reducing the reflected light, a method of forming an antireflection film on the surface of the photoresist layer has been studied. It is considered favorable that an antireflection film and a coating composition to be used for forming it have the following performance in general.

(1) It is found from a known theory regarding antireflection, the highest antireflection effect will be obtained when the refractive index of an antireflection film is equal to the square root of the refractive index of a photoresist. Since the refractive index of a common photoresist is from 1.6 to 1.8, the refractive index of an antireflection film is preferably at most 1.4.

(2) A coating composition is preferably in the form of an aqueous solution from such a viewpoint that no organic solvent has to be used in a clean room, whereby the safety can be secured and the environmental pollution can be avoided. Further, in order that it is practically used as a product, preferably it can be in the form of an aqueous solution over at least several months, i.e. it has long-term stability.

However, a conventional coating composition (see JP-A-11-124531 for example) contains methanol in addition to water as a medium in some cases, and such is not necessarily sufficiently satisfactory in view of the use in a clean room. Further, in the case of a conventional coating composition using a polymer having carboxyl groups, the polymer is neutralized by forming it into a form of an ammonium salt by using e.g. ammonia or tetramethylammonium hydroxide so as to impart water solubility to the polymer. Such a neutralized carboxyl group-containing polymer may have sufficient water solubility immediately after the production, but may aggregate with time, and such a polymer can hardly be used practically.

DISCLOSURE OF THE INVENTION

It is an object of the present invention to provide a coating composition from which an antireflection film having a refractive index lower than 1.4 can be formed, which is excellent in water solubility and which is also excellent in long-term stability.

The present invention has been made to achieve the above objects, and provides the following.

(1) A coating composition comprising a fluoropolymer having ionic functional groups, an acid and an aqueous medium.

(2) The coating composition according to the above (1), wherein the fluoropolymer is a polymer containing polymer units represented by the following formula 1:

—CF$_2$CF [O(CF$_2$CF(CF$_3$)O)$_p$(CF$_2$)$_q$Z]—    Formula 1 wherein p represents an integer of from 0 to 5, q represents an integer of from 1 to 5, and Z represents —COOH or —SO$_3$H.

(3) The coating composition according to the above (1) or (2), wherein the acid is a carboxylic acid, a sulfonic acid, a phosphonic acid, an amino acid or an aminosulfonic acid.

(4) The coating composition according to the above (1), (2) or (3), wherein the fluoropolymer is a polymer containing polymer units of —CF$_2$CF$_2$—.

(5) The coating composition according to any one of the above (1) to (4), wherein the aqueous medium is water.

(6) An antireflection film formed by using the coating composition as defined in any one of the above (1) to (5).

(7) A photoresist having the antireflection film as defined in the above (6).

(8) A pattern formation method by means of photolithography by using the photoresist as defined in the above (7).

BEST MODE FOR CARRYING OUT THE INVENTION

The fluoropolymer in the present invention has ionic functional groups. The ionic functional groups may, for example, be —COOH, —SO$_3$H, —OP(=O)(OH)$_2$, —N(CH$_3$)$_2$, —N(C$_2$H$_5$)$_2$ or —N$^+$(CH$_3$)$_3$Cl$^-$. Among them, an acid form functional group such as —COOH, —SO$_3$H or —OP(=O)(OH)$_2$ is preferred, and —COOH or —SO$_3$H is particularly preferred.

The fluoropolymer in the present invention preferably has polymer units having ionic functional groups. The polymer units are preferably polymer units represented by the following Formula 1 or 2, particularly preferably polymer units represented by the following Formula 1:

—CF$_2$CF[O(CF$_2$CF(CF$_3$)O)$_p$(CF$_2$)$_q$Z]—    Formula 1

—CF$_2$CF[(CF$_2$)$_u$Z]—    Formula 2 wherein p represents an integer of from 0 to 5, q represents an integer of from 1 to 5, u represents an integer of from 1 to 10, and Z represents —COOH or —SO$_3$H.

As a fluoromonomer forming the polymer units, CF$_2$=CF[O(CF$_2$CF(CF$_3$)O)$_p$(CF$_2$)$_q$Z] or CF$_2$=CF[(CF$_2$)$_u$Z] may, for example, be preferably mentioned. In the above monomer, p is preferably from 0 to 3, q is preferably from 1 to 3, and u is preferably from 1 to 5.

The fluoropolymer in the present invention may contain polymer units of a fluoromonomer other than the above. As such a fluoromonomer, the following monomers are preferably mentioned.

CF$_2$=CF$_2$, CF$_2$=CFCF$_3$, CF$_2$=CFCF$_2$CF$_3$, CF$_2$=CF(CF$_2$)$_k$, CF$_2$=CH$_2$, CF$_3$CH$_2$=CH(CF$_2$)$_k$CF$_3$, CH$_2$=CH[(CF$_2$)$_k$CF$_3$], CH$_2$=CH[CH$_2$(CF$_2$)$_k$CF$_3$], CH$_2$=CHCH$_2$(CF$_2$)$_k$CF$_3$, CF$_2$=CF[O(CF)$_k$CF$_3$], CF$_2$=CF[OCH$_2$(CF$_2$)$_k$CF$_3$ (wherein k represents an integer of from 1 to 10), etc. Particularly, CF$_2$=CF$_2$, CF$_2$=CFCF$_3$ and the like are preferred.

As specific examples of the fluoropolymer in the present invention, preferred are fluoropolymers (X) containing polymer units such as —[CF$_2$CF(OCF$_2$CF$_2$CF$_2$COOH)]—, —[CF$_2$CF(OCF$_2$CF(CF$_3$)OCF$_2$CF$_2$COOH)]—, —[CF$_2$CF(OCF$_2$CF(CF$_3$)OCF$_2$CF$_2$CF$_2$COOH)]—, —[CF$_2$CF[OCF$_2$CF(CF$_3$)OCF$_2$CF$_2$SO$_3$H— and —CF$_2$CF$_2$—.

The fluoropolymer in the present invention may contain polymer units having an etheric oxygen atom in its main chain. In such a case, the polymer units are preferably the following polymer units:

—CF$_2$CF(CF$_3$)O—, —(CF$_2$)$_t$O—, —CF(CF$_3$)CF$_2$O— (wherein t represents an integer of from 1 to 3), etc.

In the present invention, the fluoropolymer containing polymer units having an etheric oxygen atom in its main chain may also be a commercial polymer such as a fluorine-containing polyether having ionic functional groups. For example, a fluoropolymer (Y) such as "PT-5045" manufactured by Ausimont K.K. [(HO)$_2$P(=O)O—CH$_2$CH$_2$OCH$_2$CF$_2$O(CF$_2$CF$_2$O)$_n$(CF$_2$)$_m$CF$_2$OCH$_2$CH$_2$—OP(=O) (OH)$_2$] or "Krytox157FSL (molecular weight: 2,500)" manufactured by Du Pont K.K. [F[CF(CF$_3$)CF$_2$O] CF(CF$_3$)COOH] may be preferably mentioned.

The mass average molecular weight of the fluoropolymer in the present invention is preferably at most 50,000 in view of excellent water solubility. The mass average molecular weight is preferably at most 30,000 with a view to securing excellent water solubility even when the fluoropolymer in the coating composition has a high concentration. Further, the mass average molecular weight is preferably at least 1,000 in view of excellent film formation properties when a film is to be formed by using the coating composition containing the fluoropolymer.

A method of producing the fluoropolymer in the present invention is not particularly limited, but the following method (A) or (B) may be preferably mentioned.

(A) A method of polymerizing a fluoromonomer having a functional group capable of being converted into an ionic functional group, and converting functional groups capable of being converted into ionic functional groups into ionic functional groups.

(B) A method of polymerizing a fluoromonomer, and introducing ionic functional groups to part of the obtained polymer.

As examples of the method (A), a method of polymerizing CF$_2$=CF[O(CF$_2$CF(CF$_3$)O)$_p$(CF$_2$)$_q$COOCH$_3$] (p and q are as defined above) or CF$_2$=CF[(CF$_2$)$_u$COOCH$_3$] (u is as defined above) and then hydrolyzing the —COOCH$_3$ moiety, and a method of polymerizing CF$_2$=CF[O(CF$_2$CF(CF$_3$) O)$_p$(CF$_2$)$_q$SO$_2$F] (p and q are as defined above) or CF$_2$=CF [(CF$_2$)$_u$SO$_2$F] (u is as defined above), and hydrolyzing the —SO$_2$F moiety, may be preferably mentioned.

The polymerization method is not particularly limited, but a polymerization reaction by adding a polymerization initiator to the above fluoromonomer, followed by heating is preferred. The polymerization initiator is preferably a peroxide, an azo compound or the like. The peroxide may, for example, be preferably a peroxyketal, a diacylperoxide, a peroxycarbonate or a peroxyester. The azo compound may, for example, be preferably an azonitrile, an azoamide, a cyclic azoamide or an azoamidine.

The following compounds may be preferably mentioned as specific examples of the polymerization initiator.

Peroxyketals such as 1,1-bis(t-butylperoxy)-3,3,5-trimethylcyclohexane, 1,1-bis(t-butylperoxy)cycolhexane, n-butyl-4,4-bis(t-butylperoxy)pentanoate, 2,2-bis(t-butylperoxy) butane, 1,1-bis(t-hexylperoxy)-3,3,5-trimethylcyclohexane, 1,1-bis(t-hexylperoxy)cyclohexane, 1,1-bis(t-hexylperoxy) cyclododecane and 2,2-bis(4,4-di-t-butylperoxycyclohexyl) propane.

Diacylperoxides such as perfluorobutanoyl peroxide, isobutyryl peroxide, lauroyl peroxide, 3,5,5-trimethylhexanoyl peroxide, succinic acid peroxide, benzoyl peroxide, octanoyl peroxide and stearoyl peroxide.

Peroxydicarbonates such as diisopropyl peroxydicarbonate, di-2-ethylhexyl peroxydicarbonate, di-n-propyl peroxydicarbonate, di-2-ethoxyethyl peroxydicarbonate, di-3-methoxybutyl peroxydicarbonate and bis-(4-t-butylcyclohexyl) peroxydicarbonate.

Peroxyesters such as 1,1,3,3-tetramethylbutyl peroxyneodecanoate, t-hexyl peroxyneodecanoate, t-butyl peroxyneodecanoate, t-hexyl peroxypivalate, t-butyl peroxypivalate, 1,1,3,3-tetramethylbutyl peroxy-2-ethylhexanoate, t-hexyl peroxy-2-ethylhexanoate, t-butyl peroxy-2-ethylhexanoate, t-butyl peroxyisobutyrate, t-butyl peroxylaurate, t-butyl peroxy-3,5,5-trimethylhexanoate, t-hexyl peroxyisopropylmonocarbonate, t-butyl peroxyisopropylcarbonate, 2,5-dimethyl-2,5-bis(benzoylperoxy)hexane, t-butyl peroxyacetate and bis-t-butyl peroxyisophthalate.

As the peroxide, ammonium persulfate, potassium persulfate or the like may also be preferably mentioned.

Azonitriles such as 2,2'-azobis(4-methoxy-2,4-dimethylvaleronitrile), 2,2'-azobis(2,4-dimethylvaleronitrile), 2,2'-azobis(2-methylpropionitrile), 2,2'-azobis(2-methylbutyronitrile), 1,1'-azobis(cyclohexane-1-carbonitrile) and 1-[1-cyano-1-methylethyl]azo]formamide (2-(carbamoylazo) isobutyronitrile).

Azoamides such as 2,2'-azobis{2-methyl-N-[1,1-bis(hydoxymethyl)2-hydroxyethyl]propionamide}, 2,2'-azobis{2-methyl-N-[2-(1-hydroxybutyl)]-propionamide}, 2,2'-azobis [2-methyl-N-(2-hydroxyethyl)-propionamide] and 2,2'-azobis[N-(2-propenyl)-2-methylpropionamide].

Cyclic azoamides such as 2,2'-azobis[2-(2-imidazolin-2-yl)propane]. Azoamidines such as 2,2'-azobis(2-methylpropionamidine) and 2,2'-azobis[N-(2-hydroxyethyl)-2-methylpropionamidine].

As the azo compound, dimethyl-2,2'-azobis(2-methylpropionate), 4,4',-azobis(4-cyanopentanoic acid) or the like may also be preferably mentioned.

The amount of the polymerization initiator used is preferably from 0.01 to 10 mol % based on the total number of moles of the polymerizable monomers.

Further, a chain transfer agent may be used for the polymerization reaction. As a preferred chain transfer agent, methanol, ethanol, heptane, n-hexane or cyclohexane may, for example, be mentioned. The amount of the chain transfer agent used for the polymerization reaction is preferably from 0.01 to 10 mol % based on the total number of moles of the fluoromonomer.

A medium may be or may not be used for the polymerization reaction. When it is used, the polymerization reaction is carried out preferably in such a state that the fluoromonomer is dissolved or dispersed in the medium. The medium is preferably water, a fluorine-containing solvent or the like.

The fluorine-containing solvent may, for example, be preferably 3,3-dichloro-1,1,1,2,2-pentafluoropropane, 1,3-dichloro-1,1,2,2,3-pentafluoropropane or 1,1,1,2,2,3,3,4,4, 5,5,6,6-tridecafluorohexane.

The fluoropolymer obtained by the method (A) may be the above fluoropolymer (X).

As examples of the method (B) for producing the fluoropolymer in the present invention, a method of polymerizing CF$_3$CF=CF$_2$ or CF$_2$=CF$_2$ by means of oxygen oxidation by irradiation with ultraviolet rays, and converting the terminal group of the obtained fluorine-containing polyether into e.g. —COOH or —SO$_3$H, and a method of polymerizing hexafluoropropylene oxide with fluoride ions, and converting the terminal group into —COOH, may be preferably mentioned. As a specific example of the fluoropolymer obtained by the method (B), the above fluoropolymer (Y) may be mentioned.

The acid in the present invention is not particularly limited, and a carboxylic acid, a sulfonic acid, a phosphonic acid, an amino acid or an aminosulfonic acid may, for example, be preferably mentioned. The following acids may be mentioned as specific examples of a preferred acid.

Carboxylic acids such as formic acid, acetic acid, propionic acid, butyric acid, isobutyric acid, methoxyacetic acid, oxalic acid, malonic acid, succinic acid, lactic acid, malic acid, adipic acid and citric acid. Sulfonic acids such as methanesulfonic acid and dodecylbenzenesulfonic acid. Phosphonic acids such as phenylphosphonic acid.

Amino acids such as alanine, valine, leucine, isoleucine, proline, methionine, glycine, serine, asparagine, glutamine, arginine, threonine, cysteine, lycine, asparaginic acid, glutamic acid, histidine, N,N-bis(2-hydroxyethyl)glycine, N-[tris(hydroxymethyl)methyl]glycine and betaine.

Aminosulfonic acids such as sulfamic acid, N-(2-acetamide)-2-aminoethanesulfonic acid, N,N-bis(2-hydroxyethyl)-2-aminoethanesulfonic acid, N-cyclohexyl-3-aminopropanesulfonic acid, N-cyclohexyl-2-hydoxy-3-aminopropanesulfonic acid, N-cyclohexyl-2-aminoethanesulfonic acid, 3-[N,N-bis(2-hydroxyethyl)amino]-2-hydroxypropanesulfonic acid, 3-[4-(2-hydroxyethyl)-1-piperazinyl]propanesulfonic acid, 2-[4-(2-hydroxyethyl)-1-piperazinyl]ethanesulfonic acid, 2-hydroxy-3-[4-(2-hydroxyethyl)-1-piperazinyl]propanesulfonic acid, 2-morpholinoethanesulfonic acid, 3-morpholinopropanesulfonic acid, 2-hydroxy-3-morpholinopropanesulfonic acid, piperazine-1,4-bis(2-ethanesulfonic acid), N-tris(hydroxymethyl)methyl-3-aminopropanesulfonic acid, 2-hydroxy-N-tris(hydroxymethyl)methyl-3-aminopropanesulfonic acid and N-tris(hydroxymethyl)methyl-2-aminoethanesulfonic acid.

As the acid, sulfuric acid, phosphoric acid or the like may also be preferably mentioned.

The coating composition of the present invention contains an aqueous medium. The fluoropolymer in the present invention is excellent in water solubility and is excellent in affinity with water, and thus the aqueous medium is preferably water alone. However, an organic solvent in addition to water may also be contained as the aqueous medium. The organic solvent is preferably an alcohol such as methanol, ethanol, isopropyl alcohol, 2-butanol or hexylene glycol.

The content of the fluoropolymer in the coating composition of the present invention is not particularly limited so long as the fluoropolymer is dissolved, and is set so that an antireflection film with a desired thickness can be formed at the time of coating. The content of the fluoropolymer is preferably from 0.1 to 10 mass %, particularly preferably from 1 to 5 mass % in the coating composition.

Further, the content of the acid in the coating composition is not particularly limited so long as the fluoropolymer is dissolved. However, with a view to reducing the refractive index of a film to be formed by using the coating composition, the acid content is preferably at most the content of the fluoropolymer. The acid content is preferably at most 20 mass %, more preferably at most 10 mass % based on the polymer. In the present invention, the acid can contribute to the water solubility of the coating composition even if its content is low.

Further, the content of the aqueous medium in the coating composition is not particularly limited so long as the fluoropolymer and the acid are in a state of an aqueous solution. The content of the aqueous medium is preferably from 90 to 99.9 mass %, more preferably from 95 to 99 mass % in the coating composition.

The coating composition of the present invention may contain various functional additives depending upon its use. Particularly when it is used for the purpose of preventing reflection on the surface of a semiconductor photoresist, a water-soluble polymer other than the fluoropolymer in the present invention may be incorporated for the purpose of improving film-formation properties, a surfactant may be incorporated for the purpose of improving leveling properties and wettability to the photoresist layer, or a base may be incorporated for the purpose of relieving the intermixing with the photoresist layer.

The above water-soluble polymer may, for example, be a polyvinylpyrrolidone, a polyacrylic acid or a polyvinyl alcohol. The surfactant may, for example, be a compound having a polyfluoroalkyl group and a polyoxyethylene group (Fluorad "FC-430", "FC-4430", etc. manufactured by Sumitomo 3M Limited), acetylene glycol or a compound having polyoxyethylene added to acetylene glycol ("Surfynol104", "Surfynol420" manufactured by Air Products and Chemicals, Inc.) or a compound containing a hydroxyl group and containing no polyoxyethylene group (such as polyglycerol fatty acid ester). The base may, for example, be preferably tetramethylammonium hydroxide or trimethyl-2-hydroxyethylammonium hydroxide.

The application of the coating composition of the present invention is preferably an antireflection film for photoresist. Further, in formation of a pattern by means of photolithography using a photoresist, it is preferred to use a photoresist layer having an antireflection film formed by using the coating composition of the present invention on the surface of the photoresist layer.

The method for forming an antireflection film by using the coating composition of the present invention is preferably coating by spin coating in view of excellent uniformity of a coating film and simplicity. Further, it is preferred to carry out drying by e.g. a hotplate or an oven for the purpose of removing the aqueous medium after coating. The drying is carried out preferably under conditions at from 70 to 100° C. for from 30 to 180 seconds in the case of a hotplate.

The thickness of the antireflection film may be set in accordance with a known antireflection theory, and it is preferably an odd number times "(exposure wavelength)/(4×refractive index of the antireflection film)", in view of excellent antireflection performance.

When an antireflection film of a photoresist layer is formed by using the coating composition of the present invention, the photoresist to be used is not limited, and the coating composition of the present invention can be applied to photoresists for g-line, for i-line and for an excimer laser such as KrF or ArF.

It is important that the coating composition of the present invention contains an acid. The water solubility of the fluoropolymer improves by the presence of a small amount of an acid, whereby the long-term stability of the coating composition of the present invention improves.

EXAMPLES

Now, the present invention will be explained in detail with reference to Preparation Examples (Examples 1 to 4), Working Examples (Examples 5 to 8) and Comparative Example (Example 9), but the present invention is not limited thereto. Evaluations in Working Examples were carried out based on the following methods.

Evaluation 1: Evaluation of Refractive Index and Thickness of Film

An antireflection film was formed on the surface of a silicon wafer by spin coating using a coating composition for evaluation, and the refractive index and the thickness of the antireflection film were measured by an ellipsometer.

Evaluation 2: Evaluation of Film Removal Characteristics at the Time of Photoresist Development A silicon wafer was put in a hexamethylsilazane atmosphere for 5 minutes to treat the surface of the silicon wafer, and the surface was coated with a photoresist "THMR-iP1700 (manufactured by TOKYO OHKA KOGYO CO., LTD.) by spin coating, followed by drying on a hotplate at 90° C. for 90 seconds to form a photoresist layer having a thickness of 1 µm.

Then, the surface of the photoresist layer was coated with a coating composition for evaluation by spin coating, followed by drying on a hotplate at 90° C. for 60 seconds to form an antireflection film. The conditions for the spin coating therefor were the same conditions as in the above Evaluation 1.

The surface of the obtained antireflection film was exposed by using i-line (365 nm) via a test pattern and then baked (post exposure bake). Then, puddle development was carried out for 65 seconds by using a developer (2.38 mass % tetramethylammonium hydroxide aqueous solution), and rinsing was carried out with ultrapure water to obtain a sample having a photoresist pattern formed thereon. The obtained sample was observed by a microscope to evaluate whether the antireflection film was sufficiently removed or not at the time of development.

Example 1

The air in the system of a 1.3 L autoclave equipped with a stirrer was replaced with nitrogen, 1.18 kg of $CF_2\!=\!CFOCF_2CF_2CF_2COOCH_3$ (hereinafter referred to as CVE) and 5.30 g of diisopropyl peroxydicarbonate were charged, and the internal pressure was adjusted to 0.1 MPa by nitrogen. The autoclave was heated so that the internal temperature would be 40° C., and stirring was carried out at 40° C. for 12 hours to carry out a polymerization reaction. After completion of the stirring, unreacted CVE was distilled off to obtain 470 g of a fluoropolymer of CVE. The mass average molecular weight of the fluoropolymer was measured by a GPC method and found to be $5\times10^3$.

Water was added to the obtained fluoropolymer and heated up to 90° C., and stirred at 90° C. for 5 hours to carry out hydrolysis of methyl ester groups derived from CVE. Then, 10 g of acetic acid was added, and the temperature was increased to 90° C., followed by stirring for 1 hour, and water was added to obtain an aqueous solution having a non-volatile component concentration of 30 mass %.

Example 2

The air in the system of a 1.3 L autoclave equipped with a stirrer was replaced with nitrogen, 640 g of CVE, 34 g of tetrafluoroethylene (hereinafter referred to as TFE), 2.4 g of hexane, 2.0 g of diisopropyl peroxydicarbonate and 300 g of pentafluorodichloropropane (hereinafter referred to as HCFC) were charged, and the temperature was increased to 65° C. to carry out a polymerization reaction while 22 g of TFE was successively added. After stirring for 8 hours, no decrease in pressure was observed, whereupon the temperature was cooled to room temperature and TFE was purged. HCFC and unreacted CVE were distilled off to obtain 102 g of a fluoropolymer of CVE/TFE. The mass average molecular weight of the fluoropolymer was $4\times10^3$, and the ratio of CVE/TFE was 2.6.

Using the obtained fluoropolymer, an aqueous solution having a non-volatile component concentration of 30 mass % was obtained in the same manner as in Example 1 except that methanesulfonic acid was used instead of acetic acid.

Example 3

30 g of a 25 mass % tetramethylammonium hydroxide aqueous solution was added to 100 g of the aqueous solution obtained in Example 1, and the aqueous solution was diluted with water to prepare an aqueous solution having a non-volatile component concentration of 3 mass % and a pH of 2.0.

Example 4

The aqueous solution obtained in Example 1 was adjusted to have a non-volatile component concentration of 3 mass % by using ultrapure water, and subjected to filtration by using a polytetrafluoroethylene (PTFE) filter capable of removing particles of 0.1 µm, to obtain a coating composition for evaluation. Using the obtained composition, the above Evaluations 1 and 2 were carried out. As a result, the refractive index was 1.36, the thickness of the film was 60 nm, and the antireflection film could be completely removed at the time of the photoresist development. This composition did not undergo aggregation even after stored for one year, and had favorable stability with time.

Example 5

With respect to the aqueous solution obtained in Example 3, evaluations were carried out in the same manner as in Example 4. As a result, the refractive index was 1.40, the thickness of the film was 63 nm, and the antireflection film could be completely removed at the time of the photoresist development. Further, this composition did not undergo aggregation even after stored for one year, had favorable long-term stability.

Example 6

Water was added to the fluoropolymer obtained in Example 1, the temperature was increased up to 90° C., and stirring was carried out at 90° C. for 5 hours to carry out hydrolysis of methyl ester groups derived from CVE. Then, water was added so that the non-volatile component concentration would be 30%, the temperature was increased to 90° C., and stirring was carried out for 1 hour, but no aqueous solution was formed, and water and the fluoropolymer were separated from each other.

Example 7

60 g of water was added to 30 g of the fluoropolymer obtained in Example 1, the temperature was increased up to 90° C., and stirring was carried out at 90° C. for 5 hours to carry out hydrolysis of methyl ester groups derived from CVE. Then, water was added so that the non-volatile component concentration would be 30 mass %, the temperature was increased up to 90° C., and stirring was carried out for 1 hour. Then, 30 g of a 25 mass % tetramethylammonium hydroxide aqueous solution was added, and the mixture was diluted with water to prepare an aqueous solution having a non-volatile component concentration of 3 mass % and a pH of 2.0. This composition underwent aggregation after stored for one year, and was found to have a problem in practical use.

INDUSTRIAL APPLICABILITY

The coating composition of the present invention is useful to form an antireflection film having a refractive index lower than 1.4. The composition is excellent in water solubility and long-term stability in the form of a water solution and accordingly it can be used for formation of an antireflection film without using an organic solvent, and is suitable for operation in a clean room. Further, an antireflection film formed by using the composition can be completely removed at the time of photoresist development, and is excellent in handling efficiency in a photolithography process.

The entire disclosure of Japanese Patent Application No. 2003-021060 filed on Jan. 29, 2003 including specification, claims and summary is incorporated herein by reference in its entirety.

What is claimed is:

1. A coating composition comprising a fluoropolymer having ionic functional groups, an acid and an aqueous medium, wherein the acid is a phosphonic acid, an amino acid or an aminosulfonic acid.

2. The coating composition according to claim 1, wherein the fluoropolymer is a polymer containing polymer units represented by the following Formula 1:

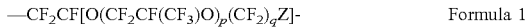   Formula 1 wherein p represents an integer of from 0 to 5, q represents an integer of from 1 to 5, and Z represent —COOH or —SO$_3$H.

3. The coating composition according to claim 1, wherein the fluoropolymer is a polymer containing polymer units of —CF$_2$CF$_2$—.

4. The coating composition according to claim 1, wherein the aqueous medium is water.

5. An antireflection film formed by using the coating composition as defined in claim 1.

6. A photoresist having the antireflection film as defined in claim 5.

7. A method of using a photoresist, the method comprising forming a pattern by means of photolithography using the photoresist as defined in claim 6.

8. The coating composition according to claim 1, wherein the composition further comprises a water-soluble polymer other than the fluoropolymer.

9. The coating composition according to claim 8, wherein the water-soluble polymer other than the fluoropolymer is selected from the group consisting of a polyvinylpyrrolidone, a polyacrylic acid and a polyvinyl alcohol.

10. A method of making a coating composition, the method comprising mixing a fluoropolymer having ionic functional groups, an acid and an aqueous medium; and producing the coating composition of claim 1.

11. The coating composition according to claim 1, wherein the acid is a phosphonic acid or an amino acid.

12. The coating composition according to claim 1, wherein the acid is an amino acid or an aminosulfonic acid.

13. The coating composition according to claim 1, wherein the acid is a phosphonic acid or an aminosulfonic acid.

14. The coating composition according to claim 1, wherein the acid is a phosphonic acid.

15. The coating composition according to claim 1, wherein the acid is an amino acid.

16. The coating composition according to claim 1, wherein the acid is an aminosulfonic acid.

* * * * *